US011211296B2

(12) United States Patent
Kawano et al.

(10) Patent No.: US 11,211,296 B2
(45) Date of Patent: Dec. 28, 2021

(54) COMPARING METHOD AND LASER PROCESSING APPARATUS

(71) Applicant: DISCO CORPORATION, Tokyo (JP)

(72) Inventors: Fumiya Kawano, Tokyo (JP); Tasuku Koyanagi, Tokyo (JP); Hiroshi Morikazu, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 66 days.

(21) Appl. No.: 16/928,450

(22) Filed: Jul. 14, 2020

(65) Prior Publication Data

US 2021/0028071 A1 Jan. 28, 2021

(51) Int. Cl.
*H01L 21/268* (2006.01)
*H01L 21/66* (2006.01)
*H01L 21/67* (2006.01)

(52) U.S. Cl.
CPC ............ *H01L 22/12* (2013.01); *H01L 21/268* (2013.01); *H01L 21/67115* (2013.01)

(58) Field of Classification Search
CPC . H01L 22/12; H01L 21/67115; H01L 21/268; H01L 21/78; H01L 21/67092; H01L 21/3043; B23K 26/359; B23K 26/364; B23K 2103/56; B23K 26/0853; B23K 26/0869; B23K 26/032; B23K 26/0006; B23K 26/36; B23K 26/0861; B23K 26/702; B23K 26/707; B23K 26/382
USPC .......................................................... 438/16
See application file for complete search history.

(56) References Cited

U.S. PATENT DOCUMENTS

| 2014/0152796 | A1* | 6/2014 | Mitsuhiro | G02B 21/247 348/79 |
| 2015/0166394 | A1* | 6/2015 | Marjanovic | B23K 26/359 428/43 |
| 2019/0033232 | A1* | 1/2019 | Ahn | G01N 21/9501 |
| 2020/0335397 | A1* | 10/2020 | Xiao | H01L 27/1218 |

FOREIGN PATENT DOCUMENTS

| JP | 2007275912 A | 10/2007 |
| JP | 2013078785 A | 5/2013 |

* cited by examiner

*Primary Examiner* — Vu A Vu
(74) *Attorney, Agent, or Firm* — Greer Burns & Crain Ltd.

(57) ABSTRACT

A comparing method includes a processing trace forming step of positioning a condenser at a reference height and a plurality of heights by moving the condenser, and forming a plurality of processing traces in one surface of a workpiece by irradiating different positions of the one surface with a laser beam according to each of the heights, a calculating step of calculating at least one of an average of widths in a plurality of predetermined directions of each of the plurality of processing traces and an area ratio of each of the plurality of processing traces to a circle of a predetermined diameter by analyzing an image of the plurality of processing traces by an image analyzing section, and a comparing step of quantitatively comparing deviations of the plurality of processing traces from a predetermined shape on the basis of at least one of the average and the area ratio.

2 Claims, 7 Drawing Sheets

COMPARING METHOD AND LASER PROCESSING APPARATUS

BACKGROUND OF THE INVENTION

Field of the Invention

The present invention relates to a comparing method of forming a plurality of processing traces in one surface of a workpiece, and quantitatively comparing deviations of the plurality of processing traces from a predetermined shape, and a laser processing apparatus including an image analyzing section that analyzes an image of a plurality of processing traces formed in one surface of a workpiece.

Description of the Related Art

A processing method is known which forms processed grooves in a wafer formed by a semiconductor material such as silicon or the like by applying a pulsed laser beam having a wavelength absorbed by the wafer along planned dividing lines set on the top surface side of the wafer (see Japanese Patent Laid-Open No. 2007-275912, for example). This processing method uses a laser processing apparatus. The laser processing apparatus includes a chuck table that sucks and holds the undersurface side of the wafer. A laser beam irradiating unit that emits the laser beam is provided above the chuck table.

The laser beam irradiating unit includes a condenser including a condensing lens disposed such that an optical axis direction thereof is parallel with a Z-axis direction. The laser beam is emitted from a laser oscillator, thereafter enters the condensing lens through optical parts such as a mirror, a lens, and the like, and is emitted from the condensing lens to the wafer. The condensing point of the laser beam emitted from the condensing lens is, for example, positioned at the top surface of the wafer. The position of the condensing point is determined by a design value of the condensing lens and the like. However, when an interval between the condensing lens and the chuck table is not determined with high accuracy, the condensing point cannot be positioned properly with respect to the wafer held on the chuck table.

Accordingly, a method is known which determines the height of the condenser when the condensing point is located at a position closest to the top surface of the wafer (see Japanese Patent Laid-Open No. 2013-78785, for example). This method forms linear processing traces on the wafer by moving the wafer and the condenser relative to each other along an X-axis direction orthogonal to a Z-axis while the height of the condenser is positioned at a plurality of different heights in a state in which the top surface side of the wafer is irradiated with a laser beam. Consequently, the processing traces having widths differing according to the height of the condenser are formed on the wafer. When a thinnest processing trace of the processing traces having the different widths is formed, the condensing point is located close to the top surface of the wafer as compared with the positions of the condensing point when processing traces having relatively large widths are formed. When the wafer is actually processed by the laser beam, the condenser is fixed at a height when the thinnest processing trace is formed.

Astigmatism may occur in the vicinity of the condensing point due to the performance of the laser oscillator and the optical parts or the like. The occurrence of the astigmatism affects the processing of the wafer as compared with a case where there is no astigmatism because the shape of the processing trace formed in the top surface of the wafer changes. Accordingly, the presence or absence of the astigmatism and the degree of the astigmatism are checked. However, the above-described method of forming linear processing traces cannot check the presence or absence and the degree of the astigmatism. In order to check the presence or absence and the like of the astigmatism, a plurality of dot-shaped processing traces are formed, for example, by positioning the condenser at a plurality of different heights, and irradiating different positions on the top surface side of the wafer with the laser beam according to each of the heights.

The processing traces formed by the above-described method may have a shape distorted from a perfect circle. The presence or absence and the like of the astigmatism are determined by measuring lengths of each of the processing traces in a lateral direction (for example, an X-axis direction) and a longitudinal direction (for example, a Y-axis direction). For example, a first graph and a second graph are prepared, the first graph having an axis of abscissas indicating the height of the condenser and having an axis of ordinates indicating the length in the lateral direction of the processing trace, and the second graph having an axis of abscissas indicating the height of the condenser and having an axis of ordinates indicating the length in the longitudinal direction of the processing trace. Next, a height (first height) of the condenser at which height the length in the lateral direction of the processing trace is minimized in the first graph is determined, and further a height (second height) of the condenser at which height the length in the longitudinal direction of the processing trace is minimized in the second graph is determined. It is determined that astigmatism exists when there is a difference between the first height of the condenser when the length in the lateral direction is minimized and the second height of the condenser when the length in the longitudinal direction is minimized. Further, when the difference between the first height and the second height of the condenser at this time is calculated, the degree of the astigmatism is identified on the basis of the difference. For example, it is determined that the larger the difference, the larger the degree of the astigmatism.

SUMMARY OF THE INVENTION

However, in a case where a worker prepares the first and second graphs, much time is taken to measure the lengths in the longitudinal and lateral directions of the processing traces. Further, there is no reference for directions in which to measure the lengths of a dot-shaped processing trace in a case where the processing trace has a shape distorted from a perfect circle. Thus, the reference for the longitudinal and lateral directions of the processing trace can differ for each worker. The present invention has been made in view of such problems. It is an object of the present invention to provide a method that can shorten a work time as compared with a case where a worker prepares graphs, and further quantitatively determines a deviation of the shape of a processing trace from a predetermined shape after eliminating a difference in a reference for measurement directions between workers.

In accordance with an aspect of the present invention, there is provided a comparing method for forming a plurality of processing traces in one surface of a workpiece by irradiating the workpiece with a pulsed laser beam having a wavelength absorbed by the workpiece, and quantitatively comparing deviations of the plurality of processing traces from a predetermined shape, the comparing method including a holding step of holding the workpiece on a holding surface of a chuck table, a reference height setting step of, on a basis of a focal length of a condensing lens of a condenser including the condensing lens configured to condense the laser beam on the workpiece and a thickness of the workpiece, setting a height of the condenser in a Z-axis direction perpendicular to the holding surface when a condensing point of the laser beam is located at the one surface of the workpiece as a reference height of the condenser, a height setting step of setting a plurality of different heights along the Z-axis direction from a first height located on one side in the Z-axis direction of the reference height to a second height located on another side in the Z-axis direction of the reference height, a processing trace forming step of positioning the condenser at the reference height and the plurality of heights by moving the condenser along the Z-axis direction, and forming the plurality of processing traces in the one surface of the workpiece by irradiating different positions of the one surface with the laser beam according to each of the heights, an image obtaining step of obtaining an image by imaging the plurality of processing traces, a calculating step of calculating at least one of an average of widths in a plurality of predetermined directions of each of the plurality of processing traces in the one surface and an area ratio of each of the plurality of processing traces to the predetermined shape by analyzing the image obtained in the image obtaining step by an image analyzing section, and a comparing step of quantitatively comparing deviations of the plurality of processing traces from the predetermined shape on a basis of at least one of the average and the area ratio calculated in the calculating step.

In accordance with another aspect of the present invention, there is provided a laser processing apparatus including a chuck table having a holding surface configured to hold a workpiece, a laser beam irradiating unit disposed above the chuck table and including a condenser including a condensing lens configured to condense a pulsed laser beam having a wavelength absorbed by the workpiece, a height setting unit configured to set, as a reference height of the condenser, a position of the condenser in a Z-axis direction perpendicular to the holding surface when a condensing point of the laser beam is located at one surface of the workpiece on a basis of a focal length of the condensing lens and a thickness of the workpiece, and setting a plurality of different heights along the Z-axis direction from a first height located on one side in the Z-axis direction of the reference height to a second height located on another side in the Z-axis direction of the reference height, a Z-axis direction moving unit configured to position the condenser at the reference height and the plurality of heights by moving the condenser along the Z-axis direction, an imaging unit disposed above the chuck table and configured to image a plurality of processing traces formed in the one surface of the workpiece by irradiating different positions of the one surface with the laser beam according to each of the heights, an image analyzing section configured to calculate at least one of an average of widths in a plurality of predetermined directions of each of the plurality of processing traces in the one surface and an area ratio of each of the plurality of processing traces to a predetermined shape by analyzing an image obtained by the imaging unit, and a comparing section configured to quantitatively compare deviations of the plurality of processing traces from the predetermined shape on a basis of at least one of the average and the area ratio calculated by the image analyzing section.

According to the present invention, in the determining method according to one aspect of the present invention, the condenser is positioned at the reference height and the plurality of heights, and a plurality of processing traces are formed by irradiating different positions of the one surface of the workpiece with the pulsed laser beam according to each of the heights (processing trace forming step). Next, an image is obtained by imaging the plurality of processing traces (image obtaining step). Further, at least one of an average of widths in a plurality of predetermined directions of each of the plurality of processing traces in the one surface and an area ratio of the processing trace to a circle of a predetermined diameter is calculated by analyzing the obtained image by the image analyzing section (calculating step). In this manner, at least one of the average of the widths and the area ratio is automatically calculated by the image analyzing section. Thus, a work time can be shortened as compared with a case where a worker measures lengths and prepares graphs. Further, deviations of the plurality of processing traces from a predetermined shape are quantitatively compared on the basis of at least one of the width average and the area ratio calculated in the calculating step (comparing step). Therefore, in the comparing step, a deviation of each of the processing traces from the predetermined shape can be quantitatively compared after a difference of each worker is eliminated.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
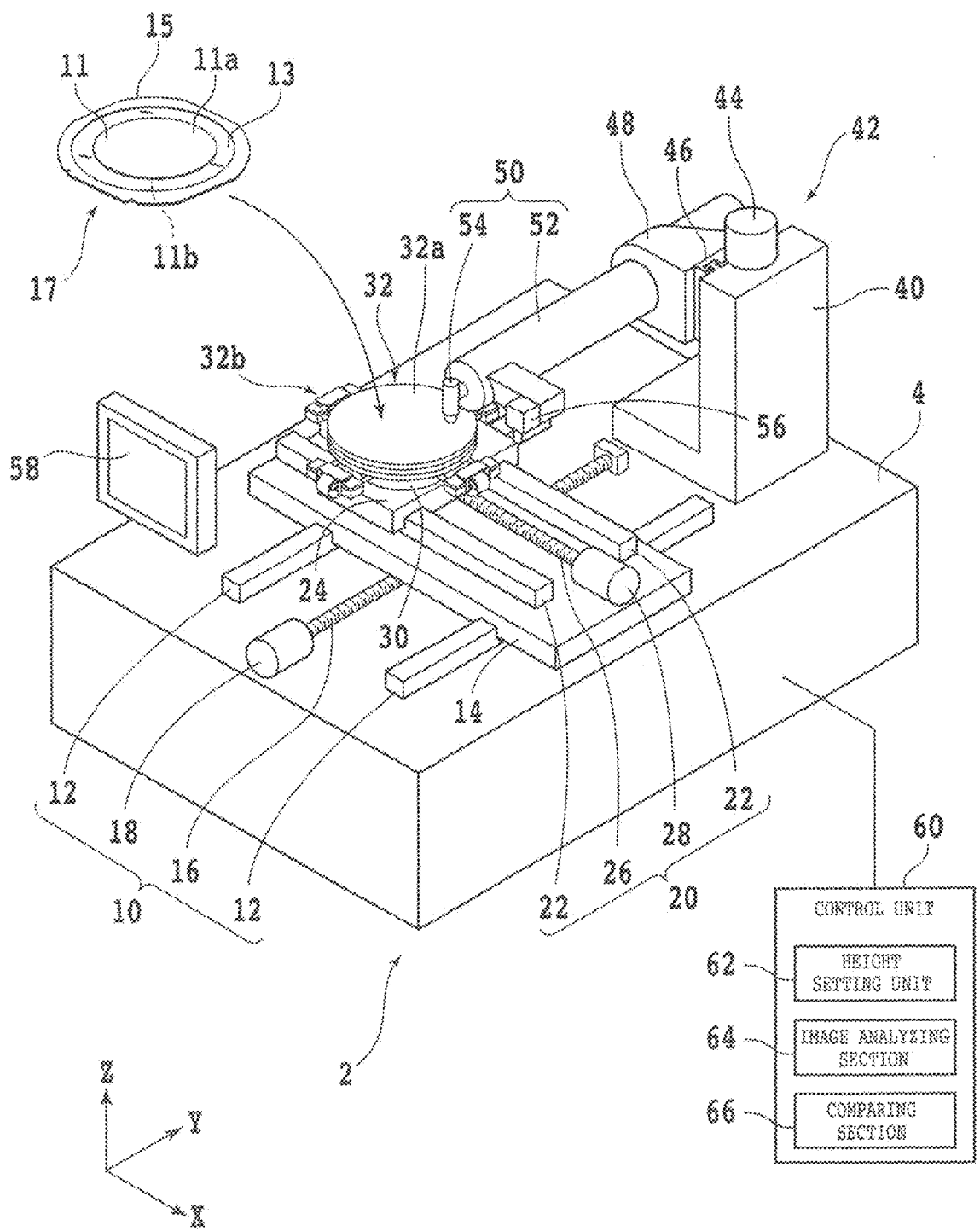
FIG. 1 is a perspective view of a laser processing apparatus.

An embodiment according to one aspect of the present invention will be described with reference to the accompanying drawings. A wafer 11 as a workpiece will be described first. The wafer 11 is, for example, formed of silicon. The wafer 11 has a flat top surface (one surface) 11*a* and a flat undersurface (another surface) 11*b*. The wafer 11 has a disk shape. The wafer 11 has a thickness of approximately 100 µm from the top surface 11*a* to the undersurface 11*b*.

Incidentally, the material of the wafer 11 is not limited to only silicon. The wafer 11 may be a laminated substrate formed by laminating one surface of a sapphire substrate and one surface of a silicon substrate to each other. In addition, the wafer 11 is not limited to a disk shape, but may be of a rectangular shape.

A dicing tape 13 made of a resin which dicing tape has a diameter larger than that of the wafer 11 is affixed to the undersurface 11b side of the wafer 11. The dicing tape 13, for example, has a laminated structure of a substrate layer and an adhesive layer. The adhesive layer side of the dicing tape 13 is affixed to the undersurface 11b of the wafer 11. An annular frame 15 formed of a metal having an opening of a diameter larger than the outside diameter of the wafer 11 is affixed to an outer circumferential portion of the dicing tape 13. A wafer unit 17 in which the wafer 11 is supported by the frame 15 via the dicing tape 13 is thus formed.

A laser processing apparatus 2 for processing the wafer 11 will next be described. FIG. 1 is a perspective view of the laser processing apparatus 2. The laser processing apparatus 2 has a rectangular parallelepiped base 4 supporting each structure. A Y-axis direction moving unit 10 is provided on the upper surface of the base 4. The Y-axis direction moving unit 10 has a pair of Y-axis guide rails 12 parallel with a Y-axis direction (a front-rear direction, or an indexing feed direction). Each of the Y-axis guide rails 12 is fixed to the upper surface of the base 4. A Y-axis moving table 14 is slidably attached to each of the Y-axis guide rails 12.

The undersurface side (lower surface side) of the Y-axis moving table 14 is provided with a nut portion (not depicted). A Y-axis ball screw 16 disposed in parallel with the Y-axis guide rails 12 is coupled in a rotatable manner to the nut portion. A Y-axis pulse motor 18 is coupled to one end of the Y-axis ball screw 16. When the Y-axis ball screw 16 is rotated by the Y-axis pulse motor 18, the Y-axis moving table 14 moves in the Y-axis direction along the Y-axis guide rails 12.

The upper surface side of the Y-axis moving table 14 is provided with an X-axis direction moving unit 20. The X-axis direction moving unit 20 has a pair of X-axis guide rails 22 in parallel with an X-axis direction (a left-right direction, or a processing feed direction). Each of the X-axis guide rails 22 is fixed to the upper surface of the Y-axis moving table 14. An X-axis moving table 24 is slidably attached to each of the X-axis guide rails 22. The lower surface side of the X-axis moving table 24 is provided with a nut portion (not depicted). An X-axis ball screw 26 disposed in parallel with the X-axis guide rails 22 is coupled in a rotatable manner to the nut portion.

An X-axis pulse motor 28 is coupled to one end of the X-axis ball screw 26. When the X-axis ball screw 26 is rotated by the X-axis pulse motor 28, the X-axis moving table 24 moves in the X-axis direction along the X-axis guide rails 22. A θ table 30 in a cylindrical shape is fixed to the upper surface side of the X-axis moving table 24. A chuck table 32 is coupled to an upper part of the θ table 30. The chuck table 32 has a metallic frame body. A recessed portion (not depicted) constituted of a disk-shaped space is formed on the upper side of the frame body.

This recessed portion is connected with one end of a flow passage for sucking gas or the like. In addition, another end of the flow passage is connected with a suction source (not depicted) such as an ejector or the like. A disk-shaped porous plate (not depicted) is fixed to the recessed portion of the frame body. When the suction source is operated, a negative pressure occurs in the upper surface of the porous plate. The upper surface functions as a holding surface 32a that sucks and holds the wafer unit 17. A plurality of clamps 32b are provided on sides of the frame body of the chuck table 32. Each of the clamps 32b clamps and fixes the outer edge of the frame 15 of the wafer unit 17 placed on the holding surface 32a.

A supporting portion 40 in the shape of a quadrangular prism is fixed to a part of the upper surface of the base 4 which part is in the vicinity of an end portion on one (rear) side in the Y-axis direction of the base 4. A Z-axis direction moving unit 42 is provided on one side surface of the supporting portion 40. The Z-axis direction moving unit 42 has a pair of Z-axis guide rails in parallel with a Z-axis direction (a direction perpendicular to the holding surface 32a, or a height direction). Each of the Z-axis guide rails is fixed to the one side surface of the supporting portion 40. A Z-axis moving plate 46 is slidably attached to each of the Z-axis guide rails.

The one surface side of the Z-axis moving plate 46 (that is, a supporting portion 40 side thereof) is provided with a nut portion (not depicted). A Z-axis ball screw (not depicted) disposed in parallel with the Z-axis guide rails is coupled in a rotatable manner to the nut portion. A Z-axis pulse motor 44 is coupled to one end of the Z-axis ball screw. When the Z-axis ball screw is rotated by the Z-axis pulse motor 44, the Z-axis moving plate 46 moves in the Z-axis direction along the Z-axis guide rails.

A holder 48 is fixed to the other surface side of the Z-axis moving plate 46 (that is, an opposite side from the supporting portion 40). A cylindrical cavity portion disposed with a height direction thereof parallel with the Y-axis direction is formed in the holder 48. A cylindrical casing 52 is fixed to the cavity portion. A condenser 54 is provided to an end portion on another (front) side in the Y-axis direction of the casing 52. The casing 52 and the condenser 54 are located above the chuck table 32, and are a part of a laser beam irradiating unit 50.

A configuration of the laser beam irradiating unit 50 will be described in the following. The laser beam irradiating unit 50 includes a laser oscillator (not depicted) that generates a laser beam by laser oscillation. The laser oscillator, for example, includes a rod-shaped laser medium formed by Nd:YAG or Nd:YVO$_4$. The laser oscillator, for example, emits a pulsed laser beam to the outside. The laser oscillator is connected with a frequency setting unit (not depicted) that sets a pulse repetition frequency of the laser beam and a pulse width adjusting unit (not depicted) that adjusts a pulse width of the laser beam. The frequency setting unit sets the pulse repetition frequency to a predetermined value from 20 kHz to 50 kHz, for example.

The laser beam emitted from the laser oscillator enters a laser beam adjusting unit (not depicted). The laser beam adjusting unit, for example, includes a wavelength converting unit that converts the wavelength of the laser beam to a wavelength of a predetermined length. The wavelength converting unit converts the laser beam to a wavelength absorbed by the wafer 11 (for example, 355 nm). In addition, the laser beam adjusting unit (not depicted) includes a power adjusting unit that adjusts the power of the laser beam, for example. The power adjusting unit adjusts an average of the power of the laser beam to 3.0 W to 6.0 W, for example.

The laser beam emitted from the laser beam adjusting unit enters the condenser 54 through optical parts such as a mirror, a lens, and the like. The condenser 54 includes a condensing lens 54a for condensing the laser beam (see FIG. 2). The condensing lens 54a is fixed within the condenser 54 in such a manner that the optical axis of the condensing lens 54a is parallel with the Z-axis direction. The laser beam L emitted from the condensing lens 54a is applied substantially vertically toward the holding surface 32a (see FIG. 2).

An imaging unit 56 is provided on one (right) side in the X-axis direction of the casing 52. The imaging unit 56 is located above the chuck table 32. The imaging unit 56, for example, includes an objective lens (not depicted) and an image sensor (not depicted) that images a subject such as the wafer 11 or the like via the objective lens. A cover portion (not depicted) is provided over the base 4. An input-output apparatus 58 is provided on a side surface on another (front) side in the Y-axis direction of the cover portion. The input-output apparatus 58 is, for example, a touch panel. The input-output apparatus 58 doubles as an input unit used by an operator when the operator inputs processing conditions or the like to the laser processing apparatus 2 and a display unit that displays the processing conditions, an image imaged by the above-described imaging unit 56, and the like.

The laser processing apparatus 2 is provided with a control unit 60 that controls operation of the Y-axis direction moving unit 10, the X-axis direction moving unit 20, the θ table 30, the chuck table 32, the Z-axis direction moving unit 42, the laser beam irradiating unit 50, and the like. The control unit 60 is formed by a computer including a processing apparatus such as a central processing unit (CPU) or the like and a storage apparatus such as a flash memory or the like. By operating the processing apparatus according to software such as a program stored in the storage apparatus or the like, the control unit 60 functions as concrete means in which the software and the processing apparatus (hardware resources) cooperate with each other. The control unit 60 includes a height setting unit 62 that sets the height (that is, the position in the Z-axis direction) of the condenser 54. The height setting unit 62 is, for example, software such as a program or the like executed by being read into the above-described processing apparatus such as the CPU or the like.

The height setting unit 62 calculates a plurality of heights at which to position the condenser 54 on the basis of information about a thickness 11c of the wafer 11, a focal length 54b of the condensing lens 54a, a movement range and a movement width of the condenser 54 in the Z-axis direction, and the like. The plurality of heights are, for example, stored in the above-described storage apparatus. In addition, the control unit 60 includes an image analyzing section 64 that analyzes an image imaged by the imaging unit 56. The image analyzing section 64 is, for example, software such as a program or the like stored in the storage apparatus and executed by being read into the above-described processing apparatus such as the CPU or the like. Incidentally, the image analyzing section 64 is not limited to software, but may be hardware such as an application-specific integrated circuit (ASIC) or the like. The control unit 60 further includes a comparing section 66 that quantitatively compares deviations of a plurality of processing traces formed in the top surface 11a of the wafer 11 from a predetermined shape on the basis of a result calculated by the image analyzing section 64. The comparing section 66 is, for example, software such as a program or the like executed by being read into the above-described processing apparatus such as the CPU or the like.

Figure 7:
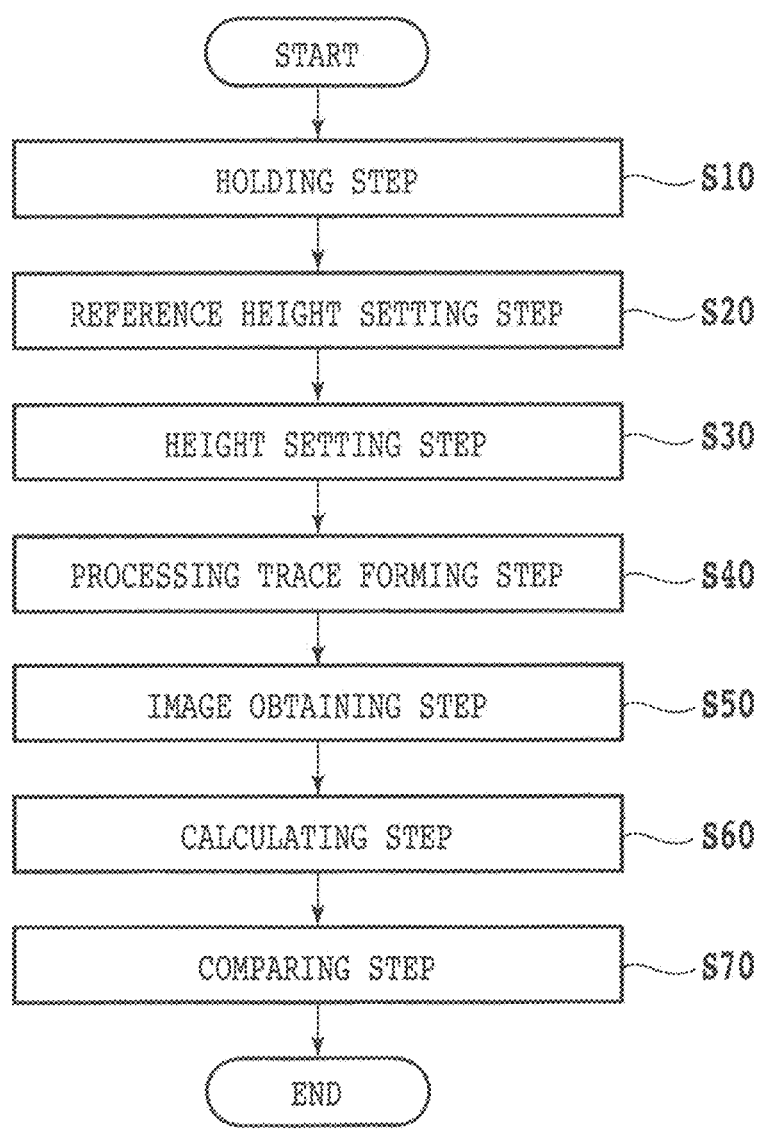
FIG. 7 is a flowchart depicting a determining method according to a first embodiment.

Description will next be made of a comparing method according to a first embodiment, the comparing method forming a processing trace A (see FIG. 3A and the like) in the top surface 11a of the wafer 11 by using the laser processing apparatus 2, and quantitatively comparing a deviation of the processing trace A from a predetermined shape. The comparing method is, for example, used when the wafer 11 is experimentally processed before laser lift-off processing is performed on a workpiece by using the laser processing apparatus 2. FIG. 7 is a flowchart depicting a determining method according to the first embodiment.

Figure 2:
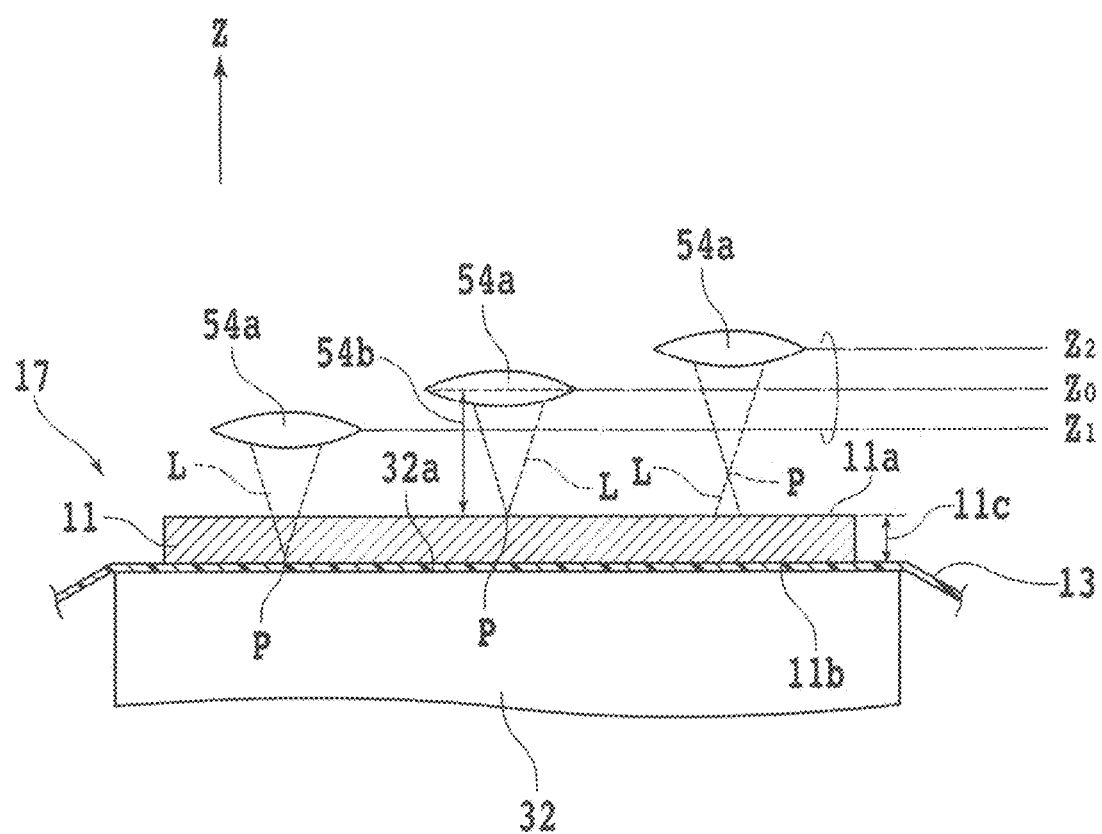
FIG. 2 is a partially sectional side view of a wafer or the like, the side view being of assistance in explaining the height of a condensing lens.

First, the wafer unit 17 is mounted on the holding surface 32a, and thereafter the undersurface 11b side of the wafer 11 is held by the holding surface 32a by operating the suction source (holding step (S10)). After the holding step (S10), the height of the condenser 54 (that is, the height of the condensing lens 54a) is adjusted. Incidentally, in the present embodiment, the height of the condensing lens 54a is regarded as the same as the height of the condenser 54. Accordingly, the height of the condensing lens 54a may be read as the height of the condenser 54. FIG. 2 is a partially sectional side view of the wafer 11 and the like, the side view being of assistance in explaining the height of the condensing lens 54a.

In the present embodiment, the height setting unit 62 sets, as a reference height $Z_0$ of the condenser 54, the height of the condensing lens 54a when a condensing point P of the laser beam L is positioned at the top surface 11a of the wafer 11 (reference height setting step (S20)). For example, a worker inputs the focal length 54b of the condensing lens 54a, the thickness 11c of the wafer 11, the thickness of the dicing tape 13, and the like to the height setting unit 62 via the input-output apparatus 58. Incidentally, the focal length 54b for the laser beam L, the thickness 11c, and the thickness of the dicing tape 13 are determined in advance. Accordingly, the condensing point P coincides with the top surface 11a when the condensing lens 54a is positioned at a height obtained by adding together the thickness 11c, the thickness of the dicing tape 13, and the focal length 54b in a case where the holding surface 32a is set as a reference. In this manner, the height setting unit 62 calculates and sets the reference height $Z_0$ of the condenser 54 on the basis of the focal length 54b, the thickness 11c, and the like in the reference height setting step (S20).

After the reference height setting step (S20), each of a plurality of heights to which to position the condensing lens 54a is set (height setting step (S30)). For example, the worker inputs a first height $Z_1$ (height of −2.0 mm) located 2 mm below (to one side in the Z-axis direction of) the reference height $Z_0$ (height of 0 mm) to the height setting unit 62 via the input-output apparatus 58. In addition, the worker inputs a second height $Z_2$ (height of +2.0 mm) located 2 mm above (to another side in the Z-axis direction of) the reference height $Z_0$ to the height setting unit 62 via the input-output apparatus 58. Further, the worker inputs a division width (0.2 mm) in a range from the first height $Z_1$ to the second height $Z_2$ to the height setting unit 62 via the input-output apparatus 58. The height setting unit 62 calculates and sets the plurality of heights on the basis of the first height $Z_1$, the second height $Z_2$, and the division width.

For example, when the condensing lens 54a is located at the reference height $Z_0$, the condensing point P of the laser beam L is located at the top surface 11a of the wafer 11. That is, the condensing point P is in a state of just focusing on the top surface 11a. When the condensing lens 54a is located at the first height $Z_1$, on the other hand, the condensing point P of the laser beam L is positioned below the top surface 11a of the wafer 11 (defocus). In addition, when the condensing lens 54a is located at the second height $Z_2$, the condensing point P of the laser beam L is positioned above the top surface 11a of the wafer 11 (defocus).

After the height setting step (S30), the control unit 60 reads each of the stored heights, and moves the laser beam irradiating unit 50 along the Z-axis direction by using the Z-axis direction moving unit 42. The condenser 54 is thereby sequentially positioned at each of the heights from the first height $Z_1$ to the second height $Z_2$. Incidentally, the Z-axis direction moving unit 42 sequentially positions the condenser 54 at each of the heights, and the Y-axis direction moving unit 10 and the X-axis direction moving unit 20 change the position of the wafer 11, so that different positions of the top surface 11a are irradiated with the laser beam L according to each of the heights. A plurality of processing traces A are thereby formed in the top surface 11a (processing trace forming step (S40)).

Figures 3A, 3B, 3C:
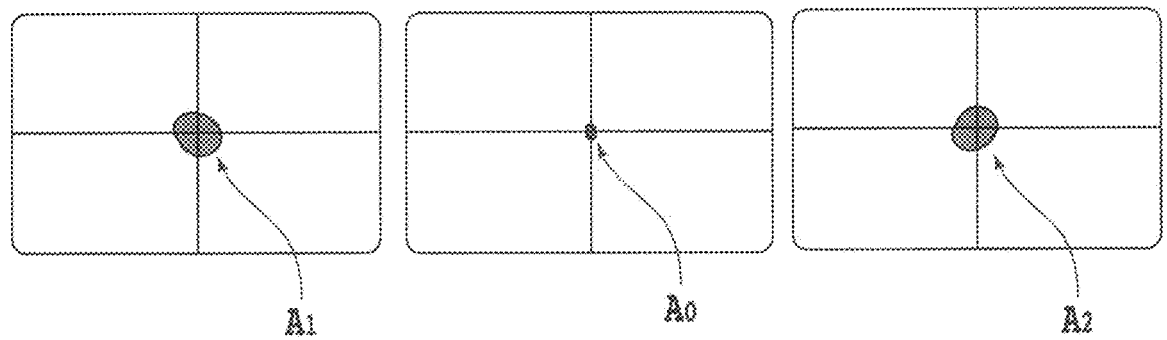
FIG. 3A is a diagram depicting an example of a processing trace when a condenser is positioned at a first height.
FIG. 3B is a diagram depicting an example of a processing trace when the condenser is positioned at a reference height.
FIG. 3C is a diagram depicting an example of a processing trace when the condenser is positioned at a second height.

For example, when the condenser 54 is positioned at the first height $Z_1$, and the wafer 11 is irradiated with the laser beam L, a processing trace $A_1$ is formed in the top surface 11a of the wafer 11. FIG. 3A represents an example of the processing trace $A_1$ when the condenser 54 is positioned at the first height $Z_1$. After the processing trace $A_1$ is formed, the condenser 54 is raised in the Z-axis direction by 0.2 mm. Together with this, the Y-axis direction moving unit 10 and the X-axis direction moving unit 20 are operated to move the condenser 54 and the chuck table 32 relative to each other so that a region different from a region in which the processing trace $A_1$ is formed is irradiated with the laser beam L. The wafer 11 is thereafter irradiated with the laser beam L. In this manner, the raising of the condenser 54 by 0.2 mm, the relative movement of the condenser 54 and the chuck table 32, and the subsequent irradiation of the wafer 11 with the laser beam L are repeated sequentially. Thus, the condenser 54 is positioned at different heights as a total of 21 (=(2.0 mm+2.0 mm)/0.2 mm+1) positions from the first height $Z_1$ to the second height $Z_2$, and the wafer 11 is irradiated with the laser beam L.

When a region different from the region in which the processing trace $A_1$ is formed is irradiated with the laser beam L in a state in which the condenser 54 is positioned at the reference height $Z_0$, a processing trace $A_0$ is formed in the top surface 11a of the wafer 11. FIG. 3B represents an example of the processing trace $A_0$ when the condenser 54 is positioned at the reference height $Z_0$. In addition, when a region different from the regions in which the processing trace $A_0$ and $A_1$ are formed is irradiated with the laser beam L in a state in which the condenser 54 is positioned at the second height $Z_2$, a processing trace $A_2$ is formed in the top surface 11a of the wafer 11. FIG. 3C represents an example of the processing trace $A_2$ when the condenser 54 is positioned at the second height $Z_2$.

Figure 4:
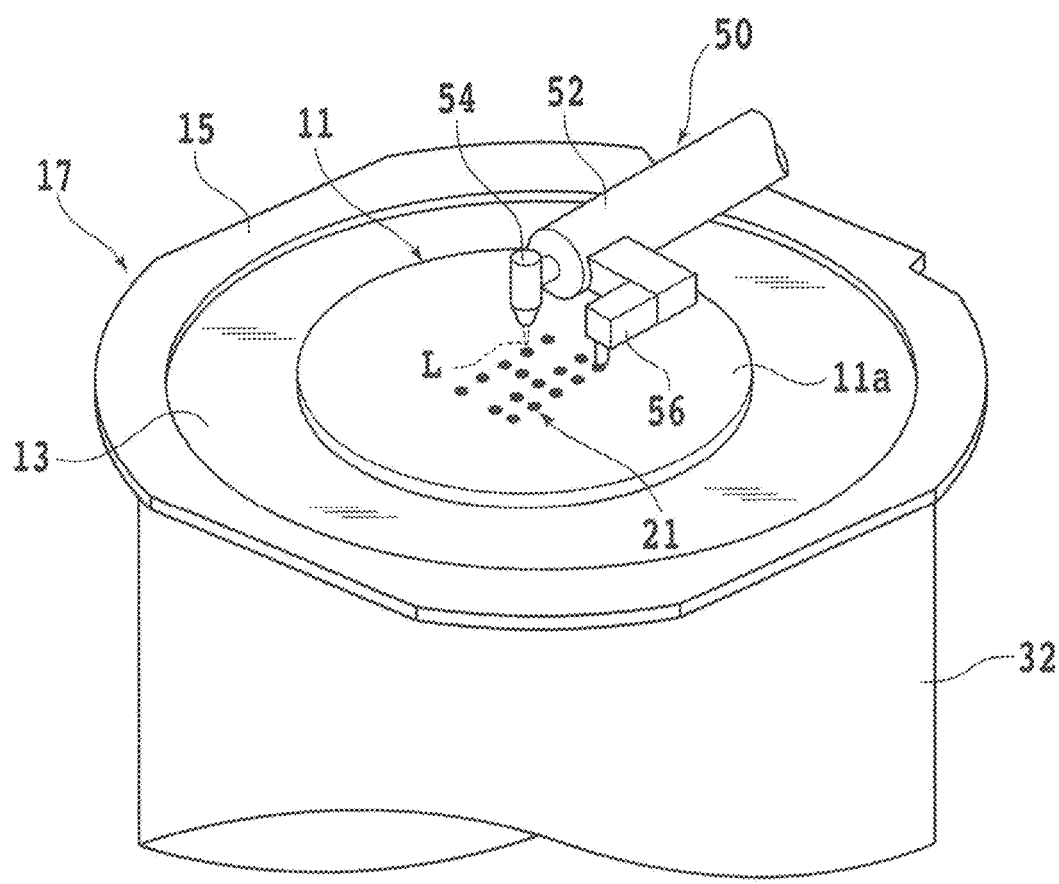
FIG. 4 is a perspective view of a laser beam irradiating unit or the like, the perspective view being of assistance in explaining a processing trace forming step.
Figure 5:
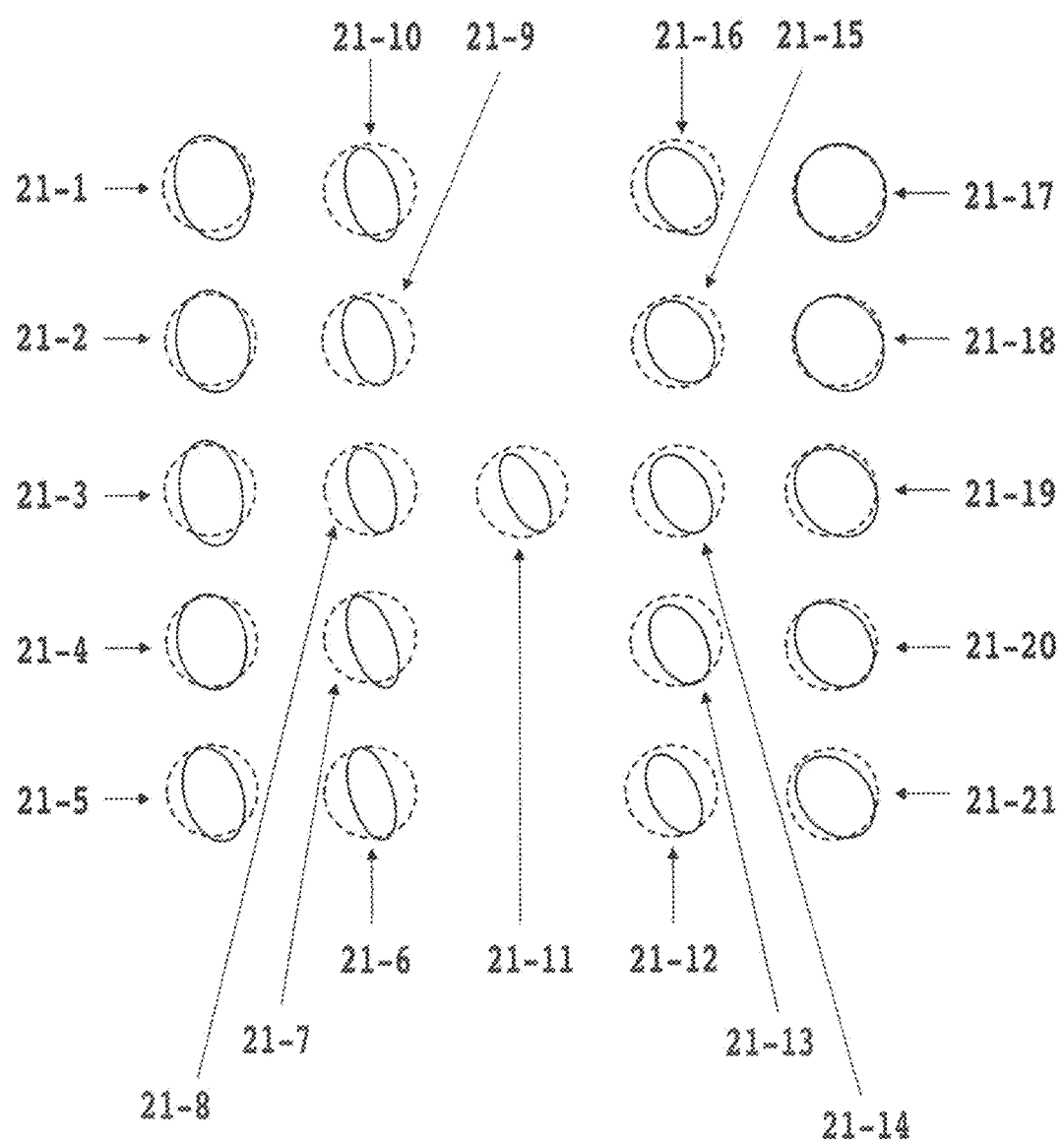
FIG. 5 is a schematic diagram of all of processing traces formed.
Figure 6:
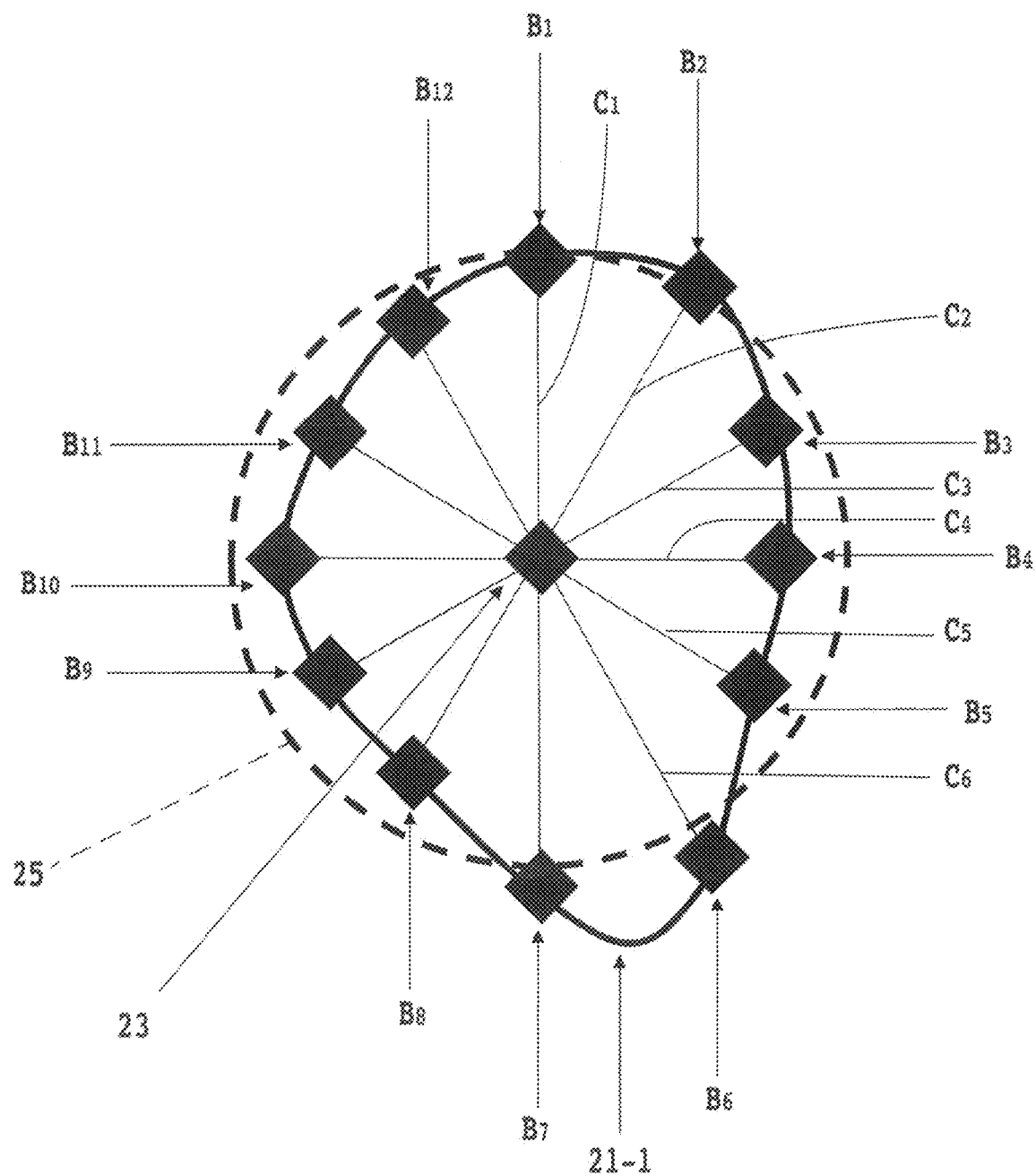
FIG. 6 is an enlarged view of a processing trace when the condenser is located at the first height.

FIG. 4 is a perspective view of the laser beam irradiating unit 50 and the like, the perspective view being of assistance in explaining the processing trace forming step (S40). After processing traces 21 are formed in different regions of the top surface 11a so as to correspond to each of the set heights, a region including all of the processing traces 21 is imaged by the imaging unit 56. An image including all of the processing traces 21 is thereby obtained (image obtaining step (S50)). FIG. 5 is a schematic diagram of all of the formed processing traces 21. In FIG. 5, reference numerals 21-1 to 21-21 are assigned to the respective processing traces in order to indicate order in which the processing traces are formed. FIG. 6 is an enlarged view of the processing trace 21-1 when the condenser 54 is located at the first height $Z_1$.

In the present embodiment, the processing trace 21-1 (corresponding to the processing trace $A_1$ in FIG. 3A) is formed first. Thereafter, the processing traces 21-2 to 21-10 are sequentially formed. Next, the processing trace 21-11 (corresponding to the processing trace $A_0$ in FIG. 3B) is formed. Thereafter, the processing traces 21-12 to 21-20 are sequentially formed. Finally, the processing trace 21-21 (corresponding to the processing trace $A_2$ in FIG. 3C) is formed. Incidentally, in FIG. 5 and FIG. 6, the contours of the processing traces 21 are provided with a solid line. While FIG. 5 depicts an approximate outline of the contour of each processing trace 21, FIG. 6 depicts details of the contour of the processing trace 21-1. In addition, in FIG. 6, the contour of the processing trace 21-1 is provided with a plurality of dots B.

The plurality of dots B are provided at predetermined angle positions with respect to a center of gravity 23 of a figure defined by the contour of the processing trace 21. Specifically, when a predetermined position in a case where the wafer 11 is viewed from above (the position of 12 o'clock in FIG. 6) is set as 0 degrees, the dots B are provided at intervals of 30 degrees. Further, in FIG. 5 and FIG. 6, a broken line represents a circle (predetermined shape) 25 of a predetermined diameter which circle has a center at the same position as the center of gravity 23 (see FIG. 6) of the figure defined by the contour of the processing trace 21. The circle 25 is a processing trace of an ideal shape which processing trace is to be formed in the top surface 11a. The circle 25 has a diameter of 50 µm. Incidentally, the circle 25 is drawn so as to be located under the processing trace 21.

After the image obtaining step (S50), at least one of a length and an area ratio each characterizing the processing trace 21 by analyzing the obtained image by the image analyzing section 64 is calculated (calculating step (S60)). Details of the calculating step (S60) will be described with reference to FIG. 6. In the calculating step (S60), for example, the length characterizing the processing trace 21-1 is calculated. The length is the width of the processing trace 21-1 which width passes through the center of gravity 23 and traverses the processing trace 21-1 (that is, the length of the processing trace 21-1).

In order to calculate the width of the processing trace 21, the center of gravity 23 of the figure defined by the contour of the processing trace 21-1 is calculated first. The coordinates of the center of gravity 23 are calculated by an arithmetic mean of coordinate values of a predetermined number of dots (12 dots in the present embodiment) located on the contour of the processing trace 21-1. After the center of gravity 23 is calculated, the respective coordinates of 12 dots $B_1$ to $B_{12}$ located at the positions of 0 degrees, 30 degrees, 60 degrees, . . . 330 degrees with respect to the center of gravity 23 are calculated. FIG. 6 depicts the dot $B_1$ located at 0 degrees with respect to the center of gravity 23, the dot $B_2$ located at 30 degrees with respect to the center of gravity 23, the dot $B_3$ located at 60 degrees with respect to the center of gravity 23, . . . the dot $B_{12}$ located at 330 degrees with respect to the center of gravity 23.

The dot $B_1$ is located at one end of a straight line within the processing trace 21-1 which straight line passes through the center of gravity 23, and the dot $B_7$ is located at another end of the straight line within the processing trace 21-1 with respect to the dot $B_1$. That is, a length from the dot $B_1$ to the dot $B_7$ is a width $C_1$ of the processing trace 21-1 which width passes through the center of gravity 23 and traverses the processing trace 21-1. Similarly, a length from the dot $B_2$ to the dot $B_8$ is a width $C_2$. A length from the dot $B_3$ to the dot $B_9$ is a width $C_3$. A length from the dot $B_4$ to the dot $B_{10}$ is a width $C_4$. A length from the dot $B_5$ to the dot $B_{11}$ is a width $C_5$. A length from the dot $B_6$ to the dot $B_{12}$ is a width $C_6$.

Next, an average D of the plurality of widths $C_1$ to $C_6$ in the plurality of directions is calculated. In the present embodiment, the plurality of directions are determined in advance, and are a direction passing through the dots $B_1$ and $B_7$, a direction passing through the dot $B_2$ and $B_8$, a direction passing through the dot $B_3$ and $B_9$, a direction passing through the dot $B_4$ and $B_{10}$, a direction passing through the dot $B_5$ and $B_{11}$, and a direction passing through the dot $B_6$ and $B_{12}$ when each processing trace 21 is viewed from above. In the calculating step (S60), the widths or the like of all of the processing traces 21 are calculated. In the present embodiment, the image analyzing section 64 automatically calculates the average D, and therefore a work time is shortened as compared with a case where the worker performs measurement or the like.

The average D in the case of the processing trace 21-1 is 56.514 μm, and the average D in the case of the processing trace 21-2 is 54.502 μm. In addition, the average D in the case of the processing trace 21-3 is 51.143 μm, and the average D in the case of the processing trace 21-4 is 49.837 μm. Further, the average D in the case of the processing trace 21-5 is 47.348 μm. Each average D is, for example, displayed on the input-output apparatus 58.

Next, on the basis of the average D calculated in the calculating step (S60), the comparing section 66 quantitatively compares a deviation of each processing trace 21 from the circle 25 (comparing step (S70)). Because the diameter of the circle 25 is 50 μm, when the average D is close to 50 μm, there is a strong possibility that the contour of the processing trace 21-1 is the same as the shape of the circle 25. When the average D is far from 50 μm, on the other hand, there is a strong possibility that the contour of the processing trace 21-1 is different from the shape of the circle 25. Accordingly, the comparing section 66, for example, determines that the processing trace 21 has a small deviation from the circle 25 when the average D is equal to or more than "Diameter of Circle 25−5 μm" or equal to or less than "Diameter of Circle 25+5 μm." In addition, the comparing section 66 may determine that the processing trace 21 has a small deviation from the circle 25 when the average D is equal to or more than "Diameter of Circle 25−10%" or equal to or less than "Diameter of Circle 25+10%."

In the present example, the averages D of the processing traces 21-2, 21-3, 21-4, and 21-5 are equal to or more than 45 μm and equal to or less than 55 μm, and therefore the comparing section 66 determines that the processing traces 21-2, 21-3, 21-4, and 21-5 have a small deviation from the circle 25. On the other hand, the average D of the processing trace 21-1 exceeds 55 μm, and therefore the comparing section 66 determines that the processing trace 21-1 has a large deviation from the circle 25. A result of the comparison and the determination by the comparing section 66 is, for example, displayed on the input-output apparatus 58. When there is one or more processing traces 21 determined to have a large deviation from the circle 25, for example, the worker inspects the laser beam irradiating unit 50 and investigates a cause of the large deviation.

In addition, the worker may adjust the optical axis of the laser beam irradiating unit 50 or the like, and quantitatively compare deviations of the processing traces 21 from the circle 25 again. The adjustment and the comparison may be repeated until there is no longer a processing trace 21 determined by the comparing section 66 to have a large deviation from the circle 25. Incidentally, the adjustment of the optical axis of the laser beam irradiating unit 50 or the like may not necessarily be performed by the worker. For example, when there is one or more processing traces 21 determined to have a large deviation from the circle 25 as a result of the comparison and the determination by the comparing section 66, the control unit 60 may automatically adjust the position of an optical part such as a mirror, a lens, or the like by operating an actuator. In the comparing step (S70) according to the present embodiment, the size of the processing trace 21 is quantitatively evaluated by using the average D. Thus, a deviation of each processing trace 21 from the circle 25 can be quantitatively compared after a difference of each worker is eliminated. It is thereby possible to grasp the processing state of the laser processing apparatus 2 precisely, and detect an abnormality in the laser processing apparatus 2.

A second embodiment of the calculating step (S60) and the comparing step (S70) will next be described. The calculating step (S60) in the second embodiment calculates a ratio of the area of a processing trace 21 to the area of the circle 25 (area ratio E) in place of the average D. The area of the processing trace 21 is calculated by performing predetermined image processing on the image obtained in the image obtaining step (S50). Then, the area ratio E is calculated by dividing the calculated area of the processing trace 21 by the area of a circle having a diameter of 50 μm. The area ratio E is automatically calculated by the image analyzing section 64. Thus, a work time is shortened as compared with a case where the worker performs measurement or the like.

The area ratio E in the case of the processing trace 21-1 is 1.19, and the area ratio E in the case of the processing trace 21-2 is 1.11. In addition, the area ratio E in the case of the processing trace 21-3 is 1.03, and the area ratio E in the case of the processing trace 21-4 is 0.92. Further, the area ratio E in the case of the processing trace 21-5 is 0.87.

Next, a deviation of each processing trace 21 from the circle 25 is quantitatively compared on the basis of the area ratio E calculated in the calculating step (S60) (comparing step (S70)). When the area ratio E is close to 1, there is a strong possibility that the contour of the processing trace 21 is the same as the shape of the circle 25. When the area ratio E is far from 1, on the other hand, there is a strong possibility that the contour of the processing trace 21 is different from the shape of the circle 25.

Accordingly, the comparing section 66 determines that the processing trace 21 has a small deviation from the circle 25 when the area ratio E is, for example, equal to or more than 0.95 and equal to or less than 1.05. In the present example, the area ratio E of the processing trace 21-3 is equal to or more than 0.95 and equal to or less than 1.05, and therefore the comparing section 66 determines that the processing trace 21-3 has a small deviation from the circle 25. On the other hand, the area ratios E of the processing traces 21-1 and 21-2 exceed 1.05, and the area ratios E of the processing traces 21-4 and 21-5 are less than 0.95. The comparing section 66 therefore determines that the processing traces 21-1, 21-2, 21-4, and 21-5 have a large deviation from the circle 25.

When there is one or more processing traces 21 determined to have a large deviation from the circle 25, for example, the worker inspects the laser beam irradiating unit 50, and investigates a cause of the large deviation. In addition, the worker may adjust the optical axis of the laser beam irradiating unit 50 or the like, and repeat the adjustment and the comparison until there is no longer a processing trace 21 determined by the comparing section 66 to have a large deviation from the circle 25. Incidentally, the adjustment of the optical axis of the laser beam irradiating unit 50 or the like may be automatically performed within the laser processing apparatus 2 according to an instruction of the control unit 60. In the comparing step (S70) according to the present embodiment, the size of the processing trace 21 is quantitatively evaluated by using the area ratio E, and therefore a deviation of each processing trace 21 from the circle 25 can be quantitatively compared after a difference of each worker is eliminated. It is thereby possible to grasp the processing state of the laser processing apparatus 2 precisely, and detect an abnormality in the laser processing apparatus 2.

A third embodiment of the calculating step (S60) and the comparing step (S70) will next be described. The calculating step (S60) in the third embodiment calculates a ratio at which the area of the circle 25 and the area of the processing trace 21 overlap each other (area ratio F) in place of the average D and the area ratio E. The area ratio F is automatically calculated by the image analyzing section 64. Thus, a work time is shortened as compared with a case where the worker performs measurement or the like. The area ratio F, also, is calculated by performing predetermined image processing on the image obtained in the image obtaining step (S50). The area ratio F in the case of the processing trace 21-1 is 1.00, and the area ratio F in the case of the processing trace 21-2 is 0.98. In addition, the area ratio F in the case of the processing trace 21-3 is 0.94, and the area ratio F in the case of the processing trace 21-4 is 0.88. Further, the area ratio F in the case of the processing trace 21-5 is 0.83.

Next, a deviation of each processing trace 21 from the circle 25 is quantitatively compared on the basis of the area ratio F calculated in the calculating step (S60) (comparing step (S70)). When the area ratio F is close to 1, there is a strong possibility that the contour of the processing trace 21 is the same as the shape of the circle 25. When the area ratio F is far from 1, on the other hand, there is a strong possibility that the contour of the processing trace 21 is different from the shape of the circle 25.

Accordingly, the comparing section 66 determines that the processing trace 21 has a small deviation from the circle 25 when the area ratio F is, for example, equal to or more than 0.95 and equal to or less than 1.05. In the present example, the area ratios F of the processing traces 21-1 and 21-2 are equal to or more than 0.95 and equal to or less than 1.05. The comparing section 66 therefore determines that the processing traces 21-1 and 21-2 have a small deviation from the circle 25. On the other hand, the area ratios F of the processing traces 21-3, 21-4, and 21-5 are less than 0.95. The comparing section 66 therefore determines that the processing traces 21-3, 21-4, and 21-5 have a large deviation from the circle 25.

When there is one or more processing traces 21 determined to have a large deviation from the circle 25, for example, the worker inspects the laser beam irradiating unit 50, and investigates a cause of the large deviation. In addition, the worker may adjust the optical axis of the laser beam irradiating unit 50 or the like, and repeat the adjustment and the comparison until there is no longer a processing trace 21 determined by the comparing section 66 to have a large deviation from the circle 25. Incidentally, the adjustment of the optical axis of the laser beam irradiating unit 50 or the like may be automatically performed within the laser processing apparatus 2 according to an instruction of the control unit 60. In the comparing step (S70) according to the present embodiment, the size of the processing trace 21 is quantitatively evaluated by using the area ratio F, and therefore a deviation of each processing trace 21 from the circle 25 can be quantitatively compared after a difference of each worker is eliminated. It is thereby possible to grasp the processing state of the laser processing apparatus 2 precisely, and detect an abnormality in the laser processing apparatus 2.

Besides, structures, methods, and the like according to the foregoing embodiments can be modified and carried out as appropriate without departing from the objective scope of the present invention. In the processing trace forming step (S40), the condenser 54 may _be sequentially positioned at each height from the second height $Z_2$ to the first height $Z_1$ in place of each height from the first height $Z_1$ to the second height $Z_2$.

In the foregoing first, second, and third embodiments, whether the laser beam irradiating unit 50 is in good condition or not is determined by using one of the average D, the area ratio E, and the area ratio F. However, two or more of the average D, the area ratio E, and the area ratio F may be combined with each other. For example, the comparing section 66 determines that the processing trace 21 has a small deviation from the circle 25 when the average D is equal to or more than "Diameter of Circle 25–5 µm" and equal to or less than "Diameter of Circle 25+5 µm" and the area ratio E is equal to or more than 0.95 and equal to or less than 1.05. The average D and the area ratio F may be similarly combined with each other, or the three of the average D, the area ratio E, and the area ratio F may be combined with each other.

In addition, the inspection of the laser beam irradiating unit 50 and the investigation of the cause of the large deviation may be performed when there are a predetermined number of processing traces 21 (for example, two processing traces 21) or more determined to have a large deviation from the circle 25. Incidentally, the predetermined shape (the circle 25 in the foregoing embodiment) compared with the processing trace 21 may not necessarily be always the same shape. For example, in a case of just focus, the area of the processing trace 21 is relatively small, and in a case of defocus, the area of the processing trace 21 is relatively large. The diameter of the circle 25 may therefore be changed according to the height of the condenser 54.

For example, the diameter of the circle 25 in the case of just focus may be smaller than the diameter of the circle 25 in the case of defocus. When the average D, the area ratio E, and the area ratio F are calculated in this manner, a deviation of the processing trace 21 from the circle 25 can be evaluated more appropriately. In addition, the threshold values of the area ratio E and the area ratio F may be changed according to the height of the condenser 54 in place of changing the diameter of the circle 25 according to the height of the condenser 54. For example, in the case of just focus, the threshold values of the area ratio E (or the area ratio F) for the comparing section 66 to determine that the processing trace 21 has a small deviation from the circle 25 may be set equal to or more than 0.90 and equal to or less than 1.00.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A comparing method for forming a plurality of processing traces in one surface of a workpiece by irradiating the workpiece with a pulsed laser beam having a wavelength absorbed by the workpiece, and quantitatively comparing deviations of the plurality of processing traces from a predetermined shape, the comparing method comprising:

a holding step of holding the workpiece on a holding surface of a chuck table;
a reference height setting step of, on a basis of a focal length of a condensing lens of a condenser including the condensing lens configured to condense the laser beam on the workpiece and a thickness of the workpiece, setting a height of the condenser in a Z-axis direction perpendicular to the holding surface when a condensing point of the laser beam is located at the one surface of the workpiece as a reference height of the condenser;
a height setting step of setting a plurality of different heights along the Z-axis direction from a first height located on one side in the Z-axis direction of the reference height to a second height located on another side in the Z-axis direction of the reference height;
a processing trace forming step of positioning the condenser at the reference height and the plurality of heights by moving the condenser along the Z-axis direction, and forming the plurality of processing traces in the one surface of the workpiece by irradiating different positions of the one surface with the laser beam according to each of the heights;
an image obtaining step of obtaining an image by imaging the plurality of processing traces;
a calculating step of calculating at least one of an average of widths in a plurality of predetermined directions of each of the plurality of processing traces in the one surface and an area ratio of each of the plurality of processing traces to the predetermined shape by analyzing the image obtained in the image obtaining step by an image analyzing section; and
a comparing step of quantitatively comparing deviations of the plurality of processing traces from the predetermined shape on a basis of at least one of the average and the area ratio calculated in the calculating step.

2. A laser processing apparatus comprising:
a chuck table having a holding surface configured to hold a workpiece;
a laser beam irradiating unit disposed above the chuck table and including a condenser including a condensing lens configured to condense a pulsed laser beam having a wavelength absorbed by the workpiece;
a height setting unit configured to set, as a reference height of the condenser, a position of the condenser in a Z-axis direction perpendicular to the holding surface when a condensing point of the laser beam is located at one surface of the workpiece on a basis of a focal length of the condensing lens and a thickness of the workpiece, and setting a plurality of different heights along the Z-axis direction from a first height located on one side in the Z-axis direction of the reference height to a second height located on another side in the Z-axis direction of the reference height;
a Z-axis direction moving unit configured to position the condenser at the reference height and the plurality of heights by moving the condenser along the Z-axis direction;
an imaging unit disposed above the chuck table and configured to image a plurality of processing traces formed in the one surface of the workpiece by irradiating different positions of the one surface with the laser beam according to each of the heights;
an image analyzing section configured to calculate at least one of an average of widths in a plurality of predetermined directions of each of the plurality of processing traces in the one surface and an area ratio of each of the plurality of processing traces to a predetermined shape by analyzing an image obtained by the imaging unit; and
a comparing section configured to quantitatively compare deviations of the plurality of processing traces from the predetermined shape on a basis of at least one of the average and the area ratio calculated by the image analyzing section.

* * * * *

UNITED STATES PATENT AND TRADEMARK OFFICE
CERTIFICATE OF CORRECTION

PATENT NO. : 11,211,296 B2
APPLICATION NO. : 16/928450
DATED : December 28, 2021
INVENTOR(S) : Kawano et al.

Page 1 of 1

It is certified that error appears in the above-identified patent and that said Letters Patent is hereby corrected as shown below:

On the Title Page

Please insert the following:
--(30) Foreign Application Priority Data
Jul. 26, 2019 (JP)................................2019-137607--

Signed and Sealed this
Twenty-fourth Day of May, 2022

Katherine Kelly Vidal
*Director of the United States Patent and Trademark Office*